United States Patent
De Ruijter

(10) Patent No.: US 7,292,092 B2
(45) Date of Patent: Nov. 6, 2007

(54) TUNABLE POLY-PHASE FILTER AND METHOD FOR CALIBRATION THEREOF

(75) Inventor: Hendricus De Ruijter, Sunnyvale, CA (US)

(73) Assignee: Integration Associates Inc., Mountain View, CA (US)

( * ) Notice: Subject to any disclaimer, the term of this patent is extended or adjusted under 35 U.S.C. 154(b) by 184 days.

(21) Appl. No.: 11/211,262

(22) Filed: Aug. 25, 2005

(65) Prior Publication Data

US 2006/0049899 A1   Mar. 9, 2006

Related U.S. Application Data

(60) Provisional application No. 60/606,037, filed on Aug. 31, 2004.

(51) Int. Cl.
*H03K 5/00* (2006.01)

(52) U.S. Cl. .................................. 327/552; 333/215
(58) Field of Classification Search ........ 327/551–559; 333/215, 167

See application file for complete search history.

(56) References Cited

U.S. PATENT DOCUMENTS

| 6,778,594 B1 * | 8/2004 | Liu ............................. 375/222 |
| 7,196,574 B1 * | 3/2007 | Vishinsky .................... 327/557 |
| 2003/0128068 A1 * | 7/2003 | Behbahani et al. ......... 327/552 |
| 2006/0017526 A1 * | 1/2006 | Hughes ....................... 333/215 |

* cited by examiner

*Primary Examiner*—Dinh T. Le
(74) *Attorney, Agent, or Firm*—Francissen Patent Law, P.C.

(57) ABSTRACT

A resonator circuit is shown that is fabricated with substantially identical elements disposed symmetrically along an axis such that the circuit has a linear response to bias current. The alignment of the circuit permits multiple characteristics of the circuit to be calibrated.

21 Claims, 2 Drawing Sheets

TUNABLE POLY-PHASE FILTER AND METHOD FOR CALIBRATION THEREOF

CROSS-REFERENCE TO RELATED PATENT APPLICATIONS

This patent application claims the benefit of U.S. Provisional Patent Application No. 60/606,037, filed Aug. 31, 2004.

FIELD OF THE INVENTION

This invention pertains to poly-phase filters and, more particularly, a tunable poly-phase filter and a method for calibration thereof.

BACKGROUND OF THE INVENTION

Gyrator type resonators are widely used to implement poly-phase filters on integrated circuits. For example, see Integration of Analog Filters in a Bipolar process. J. O. Voorman, W. H. A. Brüils and P. J. Barth, IEEE Journal of Solid-State Circuits, Vol. SC-17, No. 4, August, 1982. Their symmetrical construction makes them well suited to filtering low intermediate frequency filtering in receivers using both in-phase and quadrature-phase signals that provide low signal distortion due to the advantages of the well known image rejection and the symmetrical (around the resonance frequency) frequency responses of both the amplitude and group-delay. For example, see U.S. Pat. No. 4,193,033.

Some conventional filter implementations of the gyrator type resonator use a combination of resistors and transconductors to tune the damping and hence the bandwidth. For examples, see U.S. Pat. No. 5,220,686 or patent application WO 02/087071 A3. Tolerances and temperature dependencies of the integrated resistors, capacitors and transconductors biasing circuitry all have their effect on the filter parameters, such as center frequency, bandwidth, shape and gain. Several solutions exist to counter this alignment problem. In one example (see Datasheet TEA6850, Philips Semiconductors, July, 1994), two potentiometers need hand alignment to set the center frequency and the bandwidth. It will be evident that hand tuning is not acceptable for high volume products due to cost considerations.

A second known solution is to add separate control loops on the receiver integrated circuit. In A wideband tunable CMOS channel-select filter for a low-IF wireless receiver. F. Behbahani, W. Tan, A. Karimi, A. Roithmeier, and A. A. Abidi. Custom IC Conf., San Diego, pp. 501-504, May 1999, a channel-select filter is described. A complex mixed analog-digital automatic frequency control loop is used to tune the center frequencies of the resonators in the filter. On top of that, a second mixed analog-digital loop is required to tune the Q of the filters.

The multiple loop calibration requirement is also apparent in some products currently on the market. S. Sandee and G. van Werven (Application Note, AN 00001, version 1.2. Philips Semiconductors, Jun. 26, 2000), for example, describe a radio with circumstantial controlled selectivity wherein a 7 bit digital to analog converter (DAC) is used to calibrate the center frequency, the bandwidth is dynamically controlled using an analog loop and the gain is calibrated using a 4 bit DAC. In another current product, the TEAS5767HL (see Datasheet TEA5767HL, Philips Semiconductors, Sep. 13, 2002) shows a low intermediate frequency filter that requires two separate alignment loops, one for the center frequency and one for the gain. In addition, both loops of the TEAS5767HL require a pin and an external component. Each of these calibration loops requires a supply current, which requires additional chip area and, in some cases, requires additional interface pins and external components.

A third solution is to correct the process spread by using an external micro-controller. This approach is demonstrated in A Digitally Programmable Zero External Components FM Radio Receiver with luV Sensitivity, H. van Rumpt, D. Kasperkovitz, J. van der Tang. IEEE—ISSCC 2003 and in a part currently available on the market, see Datasheet TDA7513T, ST Microelectronics, June 2004. [10, 11]. In most products, micro-controllers have a specific function, such as polling interrupts, updating the display, controlling the modes of functions, or scanning a keypad. The introduction of micro-controlled calibration may place an undesirable load on the micro-controller along with the system bus that may impair the micro-controller's ability to perform its primary functions.

It is an objective of the invention to obviate these drawbacks so that poly phase type filters can be produced with a high production yield, using less chip area, less current consumption and no additional pins nor external components.

BRIEF SUMMARY OF THE INVENTION

In one embodiment, a resonator circuit has a first phase stage that includes a first inverting transconductor having an input and an output, a first non-inverting transconductor having an input coupled to the output of the first inverting transconductor to form a first circuit node and an output coupled to the input of the first inverting transconductor to form a second circuit node. A second inverting transconductor has an input and an output, where both the input and output are coupled to the first circuit node. A first capacitor is coupled to the first circuit node. A third inverting transconductor has an input and an output, where both the input and output are coupled to the second circuit node. A second capacitor is coupled to the second circuit node. In a further refinement of this embodiment, the first inverting transconductor, the first capacitor and the second inverting transconductor are fabricated on a die symmetrically to the first non-inverting transconductor, the second capacitor and the third inverting transconductor along an axis of the die.

In yet a further refinement, the first phase stage also includes a second non-inverting transconductor with an input for receiving a first input voltage signal and an output coupled to the first circuit node and a third non-inverting transconductor with an input for receiving a second input voltage signal and an output coupled to the second circuit node, where the second and third non-inverting transconductors are fabricated symmetrically to one another along the axis of the die.

In still another refinement, the resonator circuit includes a second phase stage that is substantially identical to the first stage, where the input of the second non-inverting transconductor of the second phase stage is coupled to the first circuit node of the first phase stage, the input of the third non-inverting transconductor of the second phase stage is coupled to the second circuit node of the first phase stage, and the resonator circuit further includes a first feedback inverting transconductor with an input coupled to the first circuit node of the second phase stage and an output coupled to the first circuit node of the first phase stage and a second feedback inverting transconductor with an input coupled to the second circuit node of the second phase stage and an output coupled to the second circuit node of the first phase stage.

In one additional refinement, the resonator circuit further includes a first current circuit configured to receive a calibration voltage signal and produce a first bias current that is proportional to the calibration voltage. A calibration circuit includes a replica of the first phase stage of the resonator circuit, where the replica is coupled to the first current circuit and is biased by the first bias current and the calibration circuit is configured to generate the calibration voltage signal. The calibration circuit is further configured to receive a reference frequency and adjust the calibration voltage signal until a resonance of the replica matches the reference frequency. A second current circuit is configured to receive the calibration voltage signal and produce a second bias current that is proportional to the calibration voltage for biasing the first inverting transconductor and the first non-inverting transconductor. A third current circuit is configured to receive the calibration voltage signal and produce a third bias current that is proportional to the calibration voltage for biasing the second inverting transconductor and the third non-inverting transconductor.

BRIEF DESCRIPTION OF THE DRAWINGS

Certain embodiments will be described with reference to the following drawings, wherein.

DETAILED DESCRIPTION OF THE INVENTION

In the present invention, by using a certain arrangement of transconductors (described in the preferred embodiments), a gyrator type poly-phase filter can be realized that has the same dependencies for both bandwidth and resonance frequency determination. Furthermore, this arrangement, in accordance to the present invention, simplifies calibration significantly: calibrating the resonance frequency or the bandwidth implicitly calibrates the remaining parameters. For example, when the resonance frequency is calibrated, then the bandwidth, forward-gain and feedback-gain are calibrated implicitly. Consequently, multiple calibration loops are not necessary.

Figure 1:
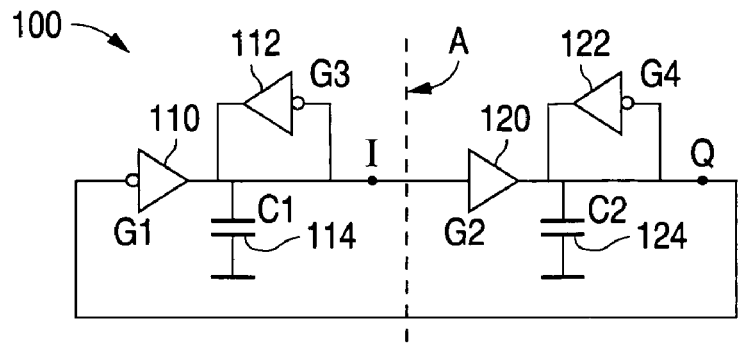
FIG. 1 is a functional block diagram illustrating an exemplary embodiment of a basic resonator circuit.

An embodiment of a basic resonator circuit, having a single phase stage, is shown in FIG. 1. Two transconductors 110 and 120, having transconductance values G1 and G2, respectively, together with two capacitors 114 and 124, having capacitance values C1 and C2, respectively, form a gyrator resonator 100. The resonator 100 is damped by transconductors 112 and 114, having having transconductance values G3 and G4, respectively, to create the desired bandwidth. Note that transconductors 110, 112 and 122 each have an inverting transconductance.

At node I, capacitor 124 (C2) behaves as an inductor due to the gyrator principle, hence an LC-like parallel resonator is formed. The same is valid at node Q, where capacitor 114 (C1) behaves as an inductor in parallel with capacitor 124. The resonance frequency is determined by the values of G1, G2, C1 and C2.

In a preferred embodiment, the resonator components, including its values and layout, are substantially symmetrical with respect to the axis A depicted in FIG. 1. Furthermore, the transconductors have substantially the same dependencies, which means that their transconductances, as a function of such factors as biasing, temperature, process spread, operating voltage, are essentially the same. An optional property of the preferred embodiment is that the transconductance of each transconductor is essentially linearly controlled as a function of the biasing current or voltage. By fabricating the resonator components on a die in a symmetrical layout and fabricating the components to have the same dependencies, the resonant frequency of the resulting resonator can be linearly controlled by the biasing current or voltage. The following values are used to demonstrate the properties of the resonator according to the embodiment of FIG. 1:

transconductance G1=transconductance G2=$g_f$
capacitance C1=capacitance C2=C
transconductance G3=transconductance G4=$g_{bw}$ With this arrangement, the resonance frequency ($F_{res}$) and the −3 dB bandwidth (BW) of the resonator are calculated as follows:

$$F_{res} = \frac{g_f}{2\pi \cdot C} \quad (1)$$

$$BW = \frac{g_{bw}}{\pi \cdot C} \quad (2)$$

Equations (1) and (2) above show that when $g_f$ and $g_{bw}$ have the same dependencies, and both are biased from a common calibration source, as is discussed in further detail below with respect to FIG. 3, then the relative error in resonance frequency is substantially equal to the relative error in the bandwidth. In other words, when one is calibrated to cancel this error, then the other is calibrated implicitly with the high accuracy of integrated component matching.

With the optional property of the preferred embodiment, e.g. all transconductances are linearly controlled as a function of the biasing current or voltage, the desired $g_f$ to $g_{bw}$ relation can be realized by a simple linear scaling of the biasing signal.

Figure 2:
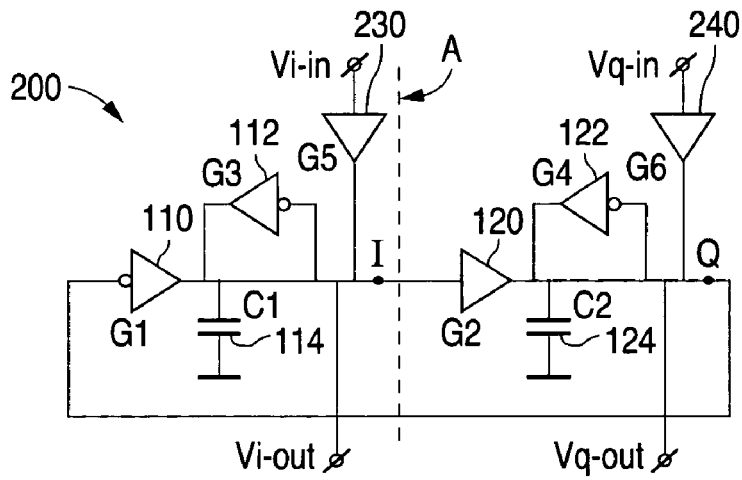
FIG. 2 is a functional block diagram of an exemplary embodiment of a first order poly-phase resonator filter.

The resonator 100 of FIG. 1 can be used to implement a first order poly-phase resonator filter 200, as shown in FIG. 2. To the circuit of FIG. 1 is added transconductor 230, which has transconductance value G5 and drives node I in response to input voltage signal Vi-in. Also added is transconductor 240, which has transconductance value G6 and drives node Q in response to input voltage signal Vq-in. The input signals Vi-in and Vq-in have a phase quadrature relation, which can be realized, for example, by a quadrature transposition stage, an example of which is illustrated in U.S. Pat. No. 4,193,033. Output voltages Vi-out and Vq-out appear at circuit nodes I and Q, respectively.

In a preferred embodiment of a poly-phase resonator filter 200, the components, including values and layout, are substantially symmetrical around axis A depicted in FIG. 2. Furthermore, the transconductor devices have substantially the same dependencies, which means that their transconductances, as a function of biasing, temperature, process spread, and operating voltage, for example, are essentially the same. An optional property of the preferred embodiment is that the transconductance of each transconductor is essentially linearly controlled as a function of the biasing current or voltage. The following values are used to demonstrate the properties of the poly-phase resonator filter according to the invention:

transconductance G1=transconductance G2=$g_f$
capacitance C1=capacitance C2=C
transconductance G3=transconductance G4=$g_{bw}$
transconductance G5=transconductance G6=$g_g$ The resonance frequency and the bandwidth is as calculated in equations (1) and (2). The gain for sinusoidal inputs (cosine and sine) at the resonant frequency is expressed as follows:

$$GAIN = \frac{Vi - out}{Vi - in} = \frac{Vq - out}{Vq - in} = \frac{g_g}{g_{bw}} \quad (3)$$

Equations (2) and (3) show that when $g_{bw}$ and $g_g$ have the same dependencies, like temperature coefficient and operating voltage dependency, and all transconductors are biased from a common calibration source, then the gain is determined by a substantially constant transconductance ratio. For example, when the frequency is calibrated to cancel the resonant frequency error, then the bandwidth and gain are implicitly calibrated with the high accuracy of integrated component matching.

With the optional property of the preferred embodiment (e.g. all transconductances are linearly controlled as a function of the biasing current or voltage) the desired $g_f$ to $g_{bw}$ to $g_g$ relation can be realized by a simple linear scaling of the biasing signal.

Figure 3:
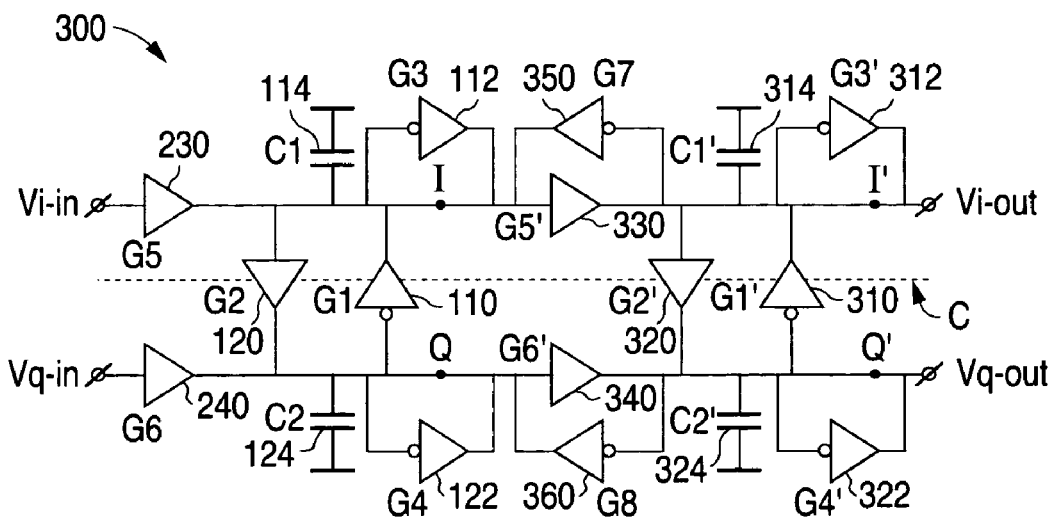
FIG. 3 is a functional block diagram of an exemplary embodiment of a poly-phase band-pass filter.

The poly-phase resonator filter 200 of FIG. 2 can be further expanded through the addition of a second phase stage to create a poly-phase band-pass filter 300, as is shown in FIG. 3. To the first phase filter stage of poly-phase filter 200 is added a second phase stage that is substantially similar to the first phase stage. The second phase stage includes transconductor 330, having transconductance G5', coupled between circuit node I and circuit node I' and transconductor 340, having transconductance G6', coupled between circuit node Q and circuit node Q'. Transconductor 310, having transconductance G1', and transconductor 320, having transconductance G2', are coupled between circuit node I' and circuit node Q' in reverse directions. Note that transconductor 310, like transconductor 110, has an inverting transconductance, while transconductors 120 and 320 have non-inverting transconductances G2 and G2', respectively.

Capacitor 314, with capacitance C1', is coupled to circuit node I' while capacitor 324, having capacitance C2', is coupled to circuit node Q'. The input and output of transconductor 312, having transconductance G3', are coupled to circuit node I' just as transconductor 112 is coupled to circuit node I. Likewise, the input and output of transconductor 322, having transconductance G4', are coupled to circuit node Q' just as transconductor 122 is coupled to circuit node Q. Transconductor 350, having transconductance G7, has its input coupled to circuit node I' and its output coupled to circuit node I. Similarly, transconductor 360, having transconductance G8, has its input coupled to circuit node Q' and its output coupled to circuit node Q.

In a preferred embodiment of a poly-phase band-pass filter 300, the components including its values and layout are substantially symmetrical around the dashed line C depicted in FIG. 3. Furthermore, the transconductors have substantially the same dependencies, which means that their transconductances as a function of biasing, temperature, process spread, and operating voltage, for example, are essentially the same. An optional property of the preferred embodiment is that the transconductance of each transconductor is essentially linearly controlled as a function of the biasing current or voltage. The following values are used to demonstrate the properties of the poly-phase band-pass filter 300 of FIG. 3:

G1=G2=G1'=G2'=$g_f$
C1=C2=C1'=C2'=C
G3=G4=G3'=G4'=$g_{bw}$
G5=G6=G5'=G6'=$g_g$
G7=G8=$g_{fb}$

The band-pass center frequency is calculated as in equation (1). The shape of the filter is determined by the feedback factor (FB):

$$FB = \frac{g_s \cdot g_{fb}}{g_{bw}^2} \quad (4)$$

Equation (4) shows that when $g_{bw}$, $g_g$ and $g_{fb}$ have the same dependencies, such as temperature coefficient and operating voltage dependency, and the transconductors are biased from a common calibration source, then the shape of the response is determined by a substantially constant transconductance ratio. For example, when the frequency is calibrated to cancel the resonance frequency error, then the bandwidth, the gain and the shape are implicitly calibrated with the high accuracy of integrated component matching. With the optional property of the preferred embodiment (e.g. all transconductances are linearly controlled as a function of the biasing current or voltage) the desired $g_f$ to $g_{bw}$ to $g_g$ to $g_{fb}$ relation can be realized by a simple linear scaling of the biasing signal.

Figure 4:
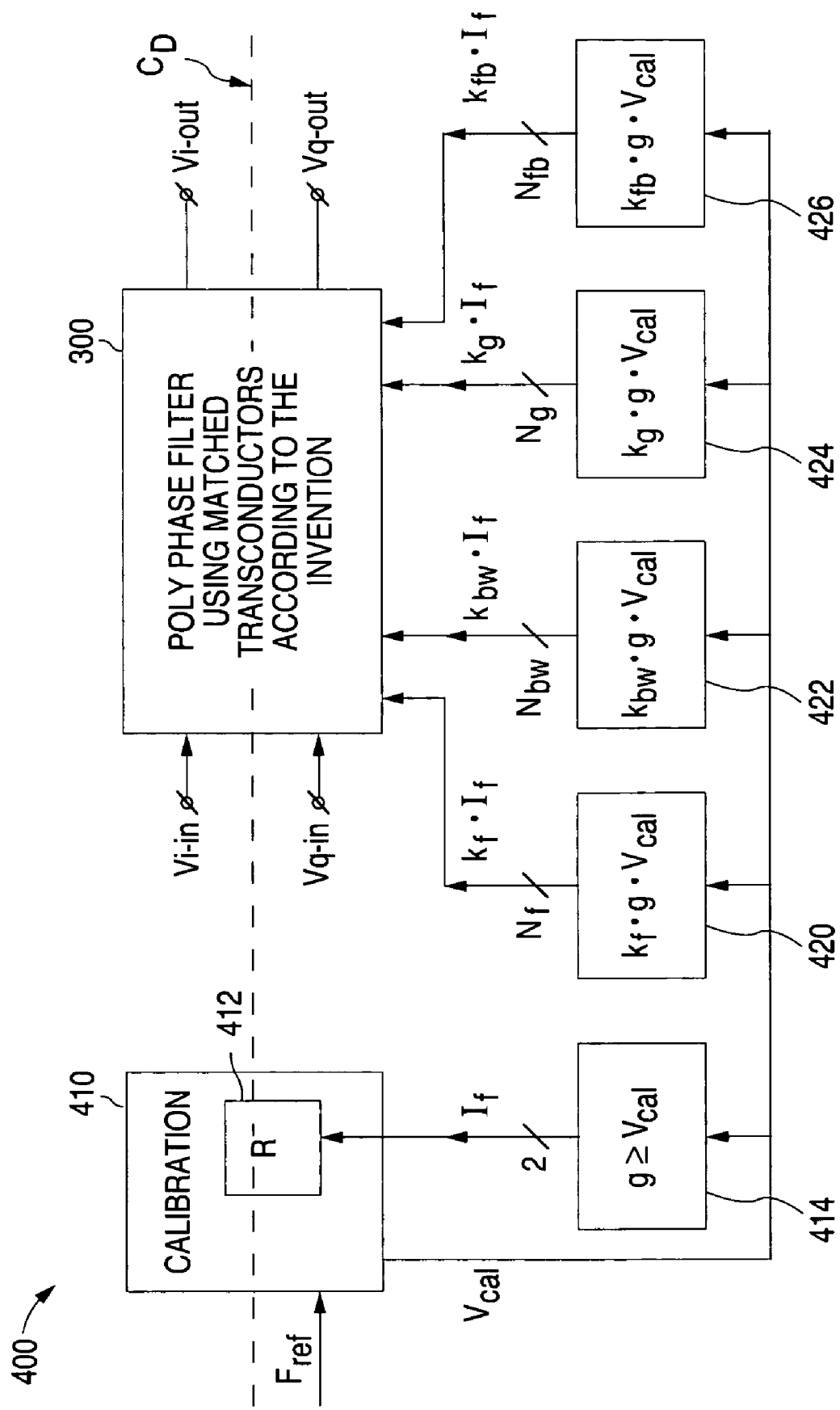
FIG. 4 is a functional block diagram of an exemplary embodiment of a circuit for implementing a calibration method.

An embodiment of a circuit 400 for application of a biasing method is shown in FIG. 4. Only one calibration circuit 410 is used in this embodiment. Calibration circuit 410 uses a resonator that is an accurate replica (or a scaled replica) of the resonator or resonators utilized in a filter, such as filter 300 in FIG. 3, that needs calibration. The replica 412 is aligned along the same axis C as the filter 300 and is composed of circuit components that are the same geometry or a scaled geometry of the components of filter 300 so that the replica 412 has the same linear response as the filter 300.

The replica is automatically aligned by calibration circuit 410 to resonate on a desired frequency by using, for example, a Phase Locked Loop (PLL) or a Frequency Locked Loop (FLL) and a reference frequency ($F_{ref}$) derived from an accurate quartz crystal. The calibration circuit 410 adjusts calibration voltage $V_{cal}$ until replica 412 resonates at the desired frequency. In this embodiment, the calibration voltage $V_{cal}$ controls a current source circuit 414 that converts the voltage into a bias current bias current ($I_f$) by multiplying the calibration current by the transistor gain (g) of the transistors of current circuit 414.

The bias current $I_f$ that is generated to provide this resonance frequency is copied to the filter 300 that needs calibration through the use of current circuits 420, 422, 424 and 426. These current circuits, in one example, are implemented as current mirrors that multiply the bias current $I_f$ generated by current circuit 414. In this embodiment, current scaling circuit 420 provides the biasing current for transconductors 110 and 120 (for the circuits of FIGS. 1 and 2), as well as transconductors 310 and 320 (for the circuit of FIG. 3) and, therefore, can be used to control the resonant frequency of the circuit 100, 200 or 300 that is being calibrated. Current scaling circuit 422 provides the biasing current for transconductors 112 and 122 (for the circuits of FIGS. 1 and 2), as well as transconductors 312 and 322 (for the circuit of FIG. 3) and, therefore, can be used to control the bandwidth of the circuit 100, 200 or 300 that is being calibrated. Current scaling circuit 424 provides the biasing current for transconductors 230 and 240 (for the circuit of FIG. 2), as well as transconductors 330 and 340 (for the circuit of FIG. 3) and, therefore, can be used to control the gain of the circuit 200 or 300 that is being calibrated. Current scaling circuit 426 provides the biasing current for transconductors 350 and 360 for the circuit of FIG. 3 and, therefore, can be used to control the feedback of the circuit 300 that is being calibrated.

In this example, the scaling factors $k_f$, $k_{bw}$, $k_g$, and $k_{fb}$ can, therefore, be implemented through the sizing of the resistors and the transistor emitter areas of the components of current scaler circuits 420, 422, 424 and 426. By way of further example, if the scaling factor $k_f$ is chosen to be 1 and the replica 412 is a 1:1 copy, then the resonators used in the filter 300 will have the same resonant frequency as the resonator replica 412 in the calibration circuit 410 with the high accuracy of the integrated component matching. The other biasing currents are derived by simply scaling the generated biasing current $I_f$. No additional calibration loops are necessary.

Depending on the complexity of the filter, several currents need to be copied into the filter, as indicated by the factor N. For example, when the filter of FIG. 3 is used, then $N_f$=4, $N_{bw}$=4, $N_g$=4 and $N_{fb}$=2. Note that different characteristics for the performance of the filter can be obtained by utilizing different ratios than those set forth for this example.

The following example calculations demonstrate the calibration method shown in FIG. 4. Some assumptions are made that are achievable through the use of integrated circuit techniques:

In this calculation example, the poly phase filter of FIG. 3 is used including the values that are listed above.

The transconductors and the capacitors used in the poly phase filters are substantially exact copies.

The resonator in the calibration circuit is substantially a replica of the resonator used in the poly phase filter.

The transconductance of each transconductor is $I_{bias}/V_T$, where $V_T$ is kT/q, k=Boltzmann's constant ($1.38 \cdot 10^{-23}$ Joule/Kelvin), T=absolute temperature in Kelvin, and q is the elementary charge of an electron ($1.6 \cdot 10^{-19}$ Coulombs).

Note that the optional property of the preferred embodiment is fulfilled with this assumption: e.g. the transconductance is a linear function of the biasing current ($I_{bias}$).

All integrated components have the same operating temperature.

The resonant frequency of the resonator in the calibration circuit is:

$$F_{res} = \frac{g_f}{2\pi \cdot C} = F_{ref} \quad (5)$$

Consequently:

$$g_f = 2\pi \cdot F_{ref} \quad (6)$$

The resonant frequency and hence the center frequency of the poly-phase filter is:

$$F_{filter} = \frac{k_f \cdot g_f}{2\pi \cdot C} = k_f \cdot F_{ref} \quad (7)$$

The bandwidth of the poly phase filter is proportional to:

$$BW = \frac{k_{bw} \cdot g_f}{\pi \cdot C} = 2 \cdot k_{bw} \cdot F_{ref} \quad (8)$$

The gain at the center frequency is equal to:

$$GAIN = \frac{g_g}{g_{bw} + \frac{g_g \cdot g_{fb}}{g_{bw}}} \quad (9)$$

$$= \frac{k_g \cdot g_f}{k_{bw} \cdot g_f + \frac{k_g \cdot g_f \cdot k_{fb} \cdot g_f}{k_{bw} \cdot g_f}}$$

$$= \frac{k_g}{k_{bw} + \frac{k_g \cdot k_{fb}}{k_{bw}}}$$

The feedback factor (FB) that determines the shape of the filter is formed by:

$$FB = \frac{g_g \cdot g_{fb}}{g_{bw}^2} = \frac{k_g \cdot g_f \cdot k_{fb} \cdot g_f}{(k_{bw} \cdot g_f)^2} = \frac{k_g \cdot k_{fb}}{k_{bw}^2} \quad (10)$$

From equations 6 to 10, it can be seen that the filter parameters are well defined and coupled to either the product of a scaling factor and the reference frequency or by a ratio of current scaling factors.

From equations 6 to 10, the tuning capabilities of the present invention also become apparent:

The center frequency can be accurately shifted by changing the $k_f$ scaling factor.

The gain, bandwidth and feedback factor (and hence the filter shape) are independent from the $k_f$ scaling factor. In other words, the filter center frequency can be tuned without affecting the remaining filter parameters.

The bandwidth can be accurately tuned by changing $k_{bw}$. When $k_g$ and $k_{fb}$ are changed proportionally then the filter gain and shape are not affected.

The gain can be changed independently when transconductors 230 and 240 (with transconductance values G5 and G6, respectively) shown in FIG. 3 are biased using a separate current scaler circuit 424.

Note that the transconductors discussed above and illustrated in the drawings are shown as single ended devices, but may be implemented as differential devices, as well, without departing from the teachings of the present invention.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A resonator circuit, the circuit having a first phase stage comprised of:
   a first inverting transconductor (110) having an input and an output;
   a first non-inverting transconductor (120) having an input coupled to the output of the first inverting transconductor (110) to form a first circuit node (I) and an output coupled to the input of the first inverting transconductor (110) to form a second circuit node (Q);
   a second inverting transconductor (112) having an input and an output, where both the input and output are coupled to the first circuit node (I);
   a first capacitor (114) coupled to the first circuit node (I);
   a third inverting transconductor (122) having an input and an output, where both the input and output are coupled to the second circuit node (Q); and
   a second capacitor (124) coupled to the second circuit node;
   where the first inverting transconductor (110), the first capacitor (114) and the second inverting transconductor (112) are fabricated on a die substantially symmetrically to the first non-inverting transconductor (120), the second capacitor (124) and the third inverting transconductor (122) along an axis (A) of the die.

2. The resonator circuit of claim 1, the first phase stage further comprising:
   a second non-inverting transconductor (230) having an input for receiving a first input voltage signal and an output coupled to the first circuit node (I); and
   a third non-inverting transconductor (240) having an input for receiving a second input voltage signal and an output coupled to the second circuit node;
   where the second and third non-inverting transconductors are fabricated symmetrically to one another along the axis (A) of the die.

3. The resonator circuit of claim 2, the circuit further including a second phase stage that is substantially identical to the first stage, wherein:
   an input of a second non-inverting transconductor (330) of the second phase stage is coupled to the first circuit node (I) of the first phase stage;
   an input of a third non-inverting transconductor (340) of the second phase stage is coupled to the second circuit node (Q) of the first phase stage; and
   the resonator circuit further comprises:
   a first feedback inverting transconductor (350) having an input coupled to a first circuit node (I') of the second phase stage and an output coupled to the first circuit node of the first phase stage (I); and
   a second feedback inverting transconductor (360) having an input coupled to a second circuit node (Q') of the second phase stage and an output coupled to the second circuit node (Q) of the first phase stage.

4. The resonator circuit of claim 1, where each transconductor has a transconductance that is substantially linearly proportional to biasing current and the circuit further comprising:
   a first current circuit (414) configured to receive a calibration voltage signal ($V_{cal}$) and produce a first bias current ($I_f$) that is proportional to the calibration voltage;
   a calibration circuit (410) that includes a replica (412) of the first phase stage of the resonator circuit, where the replica is coupled to the first current circuit and is biased by the first bias current and the calibration circuit is configured to generate the calibration voltage signal ($V_{cal}$), and where the calibration circuit is further configured to receive a reference frequency ($F_{res}$) and adjust the calibration voltage signal until a resonance of the replica (412) matches the reference frequency;
   a second current circuit (420) configured to receive the calibration voltage signal ($V_{cal}$) and produce a second bias current ($k_f*I_f$) that is proportional to the calibration voltage for biasing the first inverting transconductor (110) and the first non-inverting transconductor (120); and
   a third current circuit (422) configured to receive the calibration voltage signal ($V_{cal}$) and produce a third bias current ($k_{bw}*I_f$) that is proportional to the calibration voltage for biasing the second inverting transconductor (112) and the third non-inverting transconductor (122).

5. The resonator circuit of claim 4, wherein the second current circuit (420) is scaled to determine a resonance frequency of the resonator circuit and the third current circuit (422) is scaled to determine a bandwidth of the resonator circuit.

6. The resonator circuit of claim 2, where each transconductor has a transconductance that is substantially linearly proportional to biasing current and the circuit further comprising:
   a first current circuit (414) configured to receive a calibration voltage signal ($V_{cal}$) and produce a first bias current ($I_f$) that is proportional to the calibration voltage;
   a calibration circuit (410) that includes a replica (412) of the first phase stage of the resonator circuit, where the replica is coupled to the first current circuit and is biased by the first bias current and the calibration circuit is configured to generate the calibration voltage signal ($V_{cal}$), and where the calibration circuit is further configured to receive a reference frequency ($F_{res}$) and adjust the calibration voltage signal until a resonance of the replica (412) matches the reference frequency;

a second current circuit (420) configured to receive the calibration voltage signal ($V_{cal}$) and produce a second bias current ($k_f*I_f$) that is proportional to the calibration voltage for biasing the first inverting transconductor (110) and the first non-inverting transconductor (120); and a third current circuit (422) configured to receive the calibration voltage signal ($V_{cal}$) and 1produce a third bias current ($k_{bw}*I_f$) that is proportional to the calibration voltage for biasing the second inverting transconductor (112) and the third non-inverting transconductor (122); and a fourth current circuit (424) configured to receive the calibration voltage signal ($V_{cal}$) and produce a fourth bias current ($k_g*I_f$) that is proportional to the calibration voltage for biasing the second non-inverting transconductor (230) and the third non-inverting transconductor (240).

7. The resonator circuit of claim 6, wherein the second current circuit (420) is scaled to determine a resonance frequency of the resonator circuit, the third current circuit (422) is scaled to determine a bandwidth of the resonator circuit, and the fourth current circuit (424) is scaled to determine a gain of the resonator circuit.

8. The resonator circuit of claim 3, where each transconductor has a transconductance that is substantially linearly proportional to biasing current and the circuit further comprising:

a first current circuit (414) configured to receive a calibration voltage signal ($V_{cal}$) and produce a first bias current ($I_f$) that is proportional to the calibration voltage;

a calibration circuit (410) that includes a replica (412) of the first phase stage of the resonator circuit, where the replica is coupled to the first current circuit and is biased by the first bias current and the calibration circuit is configured to generate the calibration voltage signal ($V_{cal}$), and where the calibration circuit is further configured to receive a reference frequency ($F_{res}$) and adjust the calibration voltage signal until a resonance of the replica (412) matches the reference frequency;

a second current circuit (420) configured to receive the calibration voltage signal ($V_{cal}$) and produce a second bias current ($k_f*I_f$) that is proportional to the calibration voltage for biasing the first inverting transconductor (110) and the first non-inverting transconductor (120) of the first phase stage and the first inverting transconductor (310) and the first non-inverting transconductor (320) of the second phase stage; and a third current circuit (422) configured to receive the calibration voltage signal ($V_{cal}$) and produce a third bias current ($k_{bw}*I_f$) that is proportional to the calibration voltage for biasing the second inverting transconductor (112) and the third non-inverting transconductor (122) of the first phase stage and the second inverting transconductor (312) and the third non-inverting transconductor (322) of the second phase stage;

a fourth current circuit (424) configured to receive the calibration voltage signal ($V_{cal}$) and produce a fourth bias current ($k_g*I_f$) that is proportional to the calibration voltage for biasing the second non-inverting transconductor (230) and the third non-inverting transconductor (240) of the first phase stage and the second non-inverting transconductor (330) and the third non-inverting transconductor (340) of the second phase stage; and a fifth current circuit (426) configured to receive the calibration voltage signal ($V_{cal}$) and produce a fifth bias current ($k_{fb}*I_f$) that is proportional to the calibration voltage for biasing the first and second feedback inverting transconductors (350 and 360).

9. The resonator circuit of claim 8, wherein the second current circuit (420) is scaled to determine a resonance frequency of the resonator circuit, the third current circuit (422) is scaled to determine a bandwidth of the resonator circuit, the fourth current circuit (424) is scaled to determine a gain of the resonator circuit, and the fifth current circuit (426) is scaled to determine a feedback of the resonator circuit.

10. A method for calibrating a resonator circuit, the method comprising the steps of:

fabricating a first phase stage of the resonator circuit on a die such that the first phase stage includes:
  a first inverting transconductor (110) having an input and an output,
  a first non-inverting transconductor (120) having an input coupled to the output of the first inverting transconductor (110) to form a first circuit node (I) and an output coupled to the input of the first inverting transconductor (120) to form a second circuit node (Q),
  a second inverting transconductor (112) having an input and an output, where both the input and output are coupled to the first circuit node (I),
  a first capacitor (114) coupled to the first circuit node (I),
  a third inverting transconductor (122) having an input and an output, where both the input and output are coupled to the second circuit node (Q), and
  a second capacitor (124) coupled to the second circuit node,
  such that the first inverting transconductor (110), the first capacitor (114) and the second inverting transconductor (112) are symmetrical to the first non-inverting transconductor (120), the second capacitor (124) and the third inverting transconductor (122) along an axis (A) of the die;

providing a replica (412) to the first phase stage of the resonator circuit;

adjusting a bias current ($I_f$) of the replica (412) such that a resonant frequency of the replica matches a reference frequency ($F_{res}$);

scaling the bias current ($I_f$) of the replica (412) to produce a second bias current ($k_f*I_f$) for biasing the first inverting transconductor (110) and the first non-inverting transconductor (120) of the first phase stage; and scaling the bias current ($I_f$) of the replica (412) to produce a third bias current ($k_{bw}*I_f$) for biasing the second inverting transconductor (112) and the third non-inverting transconductor (122) of the first phase stage.

11. The method of claim 10, wherein:

the step of scaling the bias current ($I_f$) of the replica (412) to produce a second bias current ($k_f*I_f$) further comprises scaling the bias current ($I_f$) of the replica (412) to produce a second bias current ($k_f*I_f$) and determine a resonance frequency of the resonator circuit; and the step of scaling the bias current ($I_f$) of the replica (412) to produce a third bias current ($k_{bw}*I_f$) further comprises scaling the bias current ($I_f$) of the replica (412) to produce a third bias current ($k_{bw}*I_f$) and determine a bandwidth of the resonator circuit.

12. The method of claim 11, where the step of fabricating a first phase stage of the resonator circuit on a die includes fabricating the first phase stage of the resonator circuit on a die such that the first phase stage includes:
- a second non-inverting transconductor (230) having an input for receiving a first input voltage signal and an output coupled to the first circuit node (I), and
- a third non-inverting transconductor (240) having an input for receiving a second input voltage signal and an output coupled to the second circuit node, and
- where the second and third non-inverting transconductors are fabricated symmetrically to one another along the axis (A) of the die; and
- the method further includes the step of scaling the bias current ($I_f$) of the replica (412) to produce a fourth bias current ($k_g*I_f$) for biasing the second non-inverting transconductor (230) and the third non-inverting transconductor (240) of the first phase stage.

13. The method of claim 12, where the step of scaling the bias current ($I_f$) of the replica (412) to produce a fourth bias current ($k_g*I_f$) further comprises scaling the bias current ($I_f$) of the replica (412) to produce a fourth bias current ($k_g*I_f$) and determine a gain of the resonator circuit.

14. The method of claim 10, where the method further includes the step of fabricating a second phase stage that is substantially identical to the first stage, wherein:
- an input of a second non-inverting transconductor (330) of the second phase stage is coupled to the first circuit node (I) of the first phase stage,
- an input of a third non-inverting transconductor (340) of the second phase stage is coupled to the second circuit node (Q) of the first phase stage, and
- the resonator circuit further comprises:
- a first feedback inverting transconductor (350) having an input coupled to a first circuit node (I') of the second phase stage and an output coupled to the first circuit node of the first phase stage (I), and
- a second feedback inverting transconductor (360) having an input coupled to a second circuit node (Q') of the second phase stage and an output coupled to the second circuit node (Q) of the first phase stage; and
- the step of scaling the bias current ($I_f$) of the replica (412) to produce a second bias current ($k_f*I_f$) for biasing the first inverting transconductor (110) and the first non-inverting transconductor (120) of the first phase stage further includes using the second bias current ($k_f*I_f$) for biasing the first inverting transconductor (310) and the first non-inverting transconductor (320) of the second phase stage;
- the step of scaling the bias current ($I_f$) of the replica (412) to produce a third bias current ($k_{bw}*I_f$) for biasing the second inverting transconductor (112) and the third non-inverting transconductor (122) of the first phase stage further includes using the third bias current ($k_{bw}*I_f$) for biasing the second inverting transconductor (312) and the third non-inverting transconductor (322) of the second phase stage; and
- the method includes the step of scaling the bias current ($I_f$) of the replica (412) to produce a fourth bias current ($k_{fb}*I_f$) for biasing the first and second first feedback inverting transconductors (350 and 360).

15. The method of claim 14, where:
- the step of scaling the bias current ($I_f$) of the replica (412) to produce a second bias current ($k_f*I_f$) further comprises scaling the bias current ($I_f$) of the replica (412) to produce a second bias current ($k_f*I_f$) and determine a resonance frequency of the resonator circuit;
- the step of scaling the bias current ($I_f$) of the replica (412) to produce a third bias current ($k_{bw}*I_f$) further comprises scaling the bias current ($I_f$) of the replica (412) to produce a third bias current ($k_{bw}*I_f$) and determine a bandwidth of the resonator circuit; and
- the step of scaling the bias current ($I_f$) of the replica (412) to produce a fourth bias current ($k_{fb}*I_f$) further comprises scaling the bias current ($I_f$) of the replica (412) to produce a fourth bias current ($k_f*I_f$) and determine a feedback of the resonator circuit.

16. The method of claim 14, where the step of fabricating a first phase stage of the resonator circuit on a die includes fabricating the first phase stage of the resonator circuit on a die such that the first phase stage includes:
- a second non-inverting transconductor (230) having an input for receiving a first input voltage signal and an output coupled to the first circuit node (I), and
- a third non-inverting transconductor (240) having an input for receiving a second input voltage signal and an output coupled to the second circuit node, and
- where the second and third non-inverting transconductors are fabricated symmetrically to one another along the axis (A) of the die; and
- the method further includes the step of scaling the bias current ($I_f$) of the replica (412) to produce a fifth bias current ($k_g*I_f$) for biasing the second non-inverting transconductor (230) and the third non-inverting transconductor (240) of the first phase stage as well as a second non-inverting transconductor (330) and a third non-inverting transconductor (340) of the second phase stage.

17. The method of claim 16, where the step of scaling the bias current ($I_f$) of the replica (412) to produce a fifth bias current ($k_g*I_f$) further comprises scaling the bias current ($I_f$) of the replica (412) to produce a fifth bias current ($k_g*I_f$) and determine a gain of the resonator circuit.

18. A poly-phase band-pass filter circuit, the circuit comprising first and second phase stages, where each phase stage comprises:
- a first inverting transconductor (110) having an input and an output;
- a first non-inverting transconductor (120) having an input coupled to the output of the first inverting transconductor to form a first circuit node (I) and an output coupled to the input of the first inverting transconductor to form a second circuit node (Q);
- a second inverting transconductor (112) having an input and an output, where both the input and output are coupled to the first circuit node (I);
- a first capacitor (114) coupled to the first circuit node (I);
- a third inverting transconductor (122) having an input and an output, where both the input and output are coupled to the second circuit node (Q);
- a second capacitor (124) coupled to the second circuit node (Q);
- a second non-inverting transconductor (230) having an input for receiving a first input voltage signal and an output coupled to the first circuit node (I); and
- a third non-inverting transconductor (240) having an input for receiving a second input voltage signal and an output coupled to the second circuit node (Q),
- where the first inverting transconductor (110), the first capacitor (114), the second inverting transconductor (112) and the second non-inverting transconductor (230) are fabricated on a die symmetrically to the first non-inverting transconductor (120), the second capacitor (124), the third inverting transconductor (122), and the third non-inverting transconductor (240) along an axis (C) of the die, and where the input of the second non-inverting transconductor (330) of the second phase stage is coupled to the first circuit node (I) of the first phase stage, and where the input of the third non-inverting transconductor (340) of the second phase stage is coupled to the second circuit node (Q) of the first phase stage; and the resonator circuit further comprises:

a first feedback inverting transconductor (350) having an input coupled to the first circuit node (I') of the second phase stage and an output coupled to the first circuit node of the first phase stage (I); and a second feedback inverting transconductor (360) having an input coupled to the second circuit node (Q') of the second phase stage and an output coupled to the second circuit node (Q) of the first phase stage.

19. The poly-phase band-pass filter circuit of claim 18, the circuit further including:

a first current circuit (420) configured to produce a first bias current ($k_f*I_f$) for biasing the first inverting transconductor (110) and the first non-inverting transconductor (120) of the first phase stage and the first inverting transconductor (310) and the first non-inverting transconductor (320) of the second phase stage; and a second current circuit (422) configured to produce a second bias current ($k_{bw}*I_f$) for biasing the second inverting transconductor (112) and the third non-inverting transconductor (122) of the first phase stage and the second inverting transconductor (312) and the third non-inverting transconductor (322) of the second phase stage;

a third current circuit (424) configured to produce a third bias current ($k_g*I_f$) for biasing the second non-inverting transconductor (230) and the third non-inverting transconductor (240) of the first phase stage and the second non-inverting transconductor (330) and the third non-inverting transconductor (340) of the second phase stage; and a fourth current circuit (426) configured to produce a fifth bias current ($k_{fb}*I_f$) for biasing the first and second feedback inverting transconductors (350 and 360).

20. The poly-phase band-pass filter circuit of claim 19, wherein the first current circuit (420) is scaled to determine a resonance frequency of the resonator circuit, the second current circuit (422) is scaled to determine a bandwidth of the resonator circuit, the third current circuit (424) is scaled to determine a gain of the resonator circuit, and the fourth current circuit (426) is scaled to determine a feedback of the resonator circuit.

21. The poly-phase band-pass filter circuit of claim 19, where the circuit further includes:

a reference current circuit (414) configured to receive a calibration voltage signal ($V_{cal}$) and produce a reference bias current ($I_f$) that is proportional to the calibration voltage; and a calibration circuit (410) that includes a replica (412) of the first phase stage of the resonator circuit, where the replica is coupled to the first current circuit and is biased by the first bias current and the calibration circuit is configured to generate the calibration voltage signal ($V_{cal}$), and where the calibration circuit is further configured to receive a reference frequency ($F_{res}$) and adjust the calibration voltage signal until a resonance of the replica (412) matches the reference frequency; and the first current circuit (420) is further configured to receive the calibration voltage signal ($V_{cal}$) and produce the first bias current ($k_f*I_f$) proportional to the calibration voltage;

the second current circuit (422) is further configured to receive the calibration voltage signal ($V_{cal}$) and produce the second bias current ($k_{bw}*I_f$) proportional to the calibration voltage;

the third current circuit (424) is further configured to receive the calibration voltage signal ($V_{cal}$) and produce the third bias current ($k_g*I_f$ proportional to the calibration voltage; and the fourth current circuit (426) is further configured to receive the calibration voltage signal ($V_{cal}$) and produce the fourth bias current ($k_{fb}*I_f$) proportional to the calibration voltage.

* * * * *